United States Patent
Desai et al.

(10) Patent No.: US 11,336,270 B2
(45) Date of Patent: May 17, 2022

(54) FUSE-LESS SELF-START CONTROLLER

(71) Applicant: Intel Corporation, Santa Clara, CA (US)

(72) Inventors: Nachiket Desai, Hillsboro, OR (US); Suhwan Kim, Portland, OR (US); Harish Krishnamurthy, Beaverton, OR (US); Christopher Schaef, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/006,726

(22) Filed: Aug. 28, 2020

(65) Prior Publication Data
US 2022/0069810 A1 Mar. 3, 2022

(51) Int. Cl.
*H03K 3/00* (2006.01)
*H03K 3/037* (2006.01)
*H03K 5/24* (2006.01)
*H03K 17/687* (2006.01)

(52) U.S. Cl.
CPC .............. *H03K 3/037* (2013.01); *H03K 5/24* (2013.01); *H03K 17/687* (2013.01); *H03K 2217/0063* (2013.01); *H03K 2217/0072* (2013.01)

(58) Field of Classification Search
CPC ........ H03K 3/037; H03K 17/687; H03K 5/24; H03K 2217/0063; H03K 2217/0072
See application file for complete search history.

(56) References Cited

U.S. PATENT DOCUMENTS

| | | | |
|---|---|---|---|
| 9,831,762 B2* | 11/2017 | Chepuri | ............... H02M 3/158 |
| 2007/0063681 A1 | 3/2007 | Liu | |
| 2007/0120545 A1 | 5/2007 | Hata et al. | |
| 2010/0253309 A1 | 10/2010 | Xi et al. | |
| 2012/0126772 A1 | 5/2012 | Yamakoshi et al. | |
| 2016/0315532 A1 | 10/2016 | Chepuri et al. | |
| 2021/0257998 A1* | 8/2021 | Fesler | ................... H03K 3/017 |

OTHER PUBLICATIONS

International Search Report and Written Opinion dated Nov. 17, 2021 for International Application No. PCT/US2021/043046, 8 pages.

* cited by examiner

*Primary Examiner* — Metasebia T Retebo
(74) *Attorney, Agent, or Firm* — Schwabe, Williamson & Wyatt, P.C.

(57) ABSTRACT

A digital self-start controller, which is functional without fuse and/or trim information. The self-start controller protects a DC-DC converter against large inrush currents and voltage overshoots, while being capable of following a variable VID (voltage identification) reference ramp imposed by the system. The self-start controller uses a relaxation oscillator to set the switching frequency of the DC-DC converter. The oscillator can be initialized using either a clock or current reference to be close to a desired operating frequency. The output of the DC-DC converter is coupled weakly to the oscillator to set the duty cycle for closed loop operation. The controller is naturally biased such that the output supply voltage is always slightly higher than a set point, eliminating the need for any process, voltage, and/or temperature (PVT) imposed trims.

21 Claims, 7 Drawing Sheets

FUSE-LESS SELF-START CONTROLLER

BACKGROUND

Voltage regulators, such as fully integrated voltage regulator (FIVR) or other DC-DC converters, often need to generate a supply output during system startup, when fuse information is unavailable. This precludes the use of traditional steady-state controller, which typically depends on several fuses and trims for functionality.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
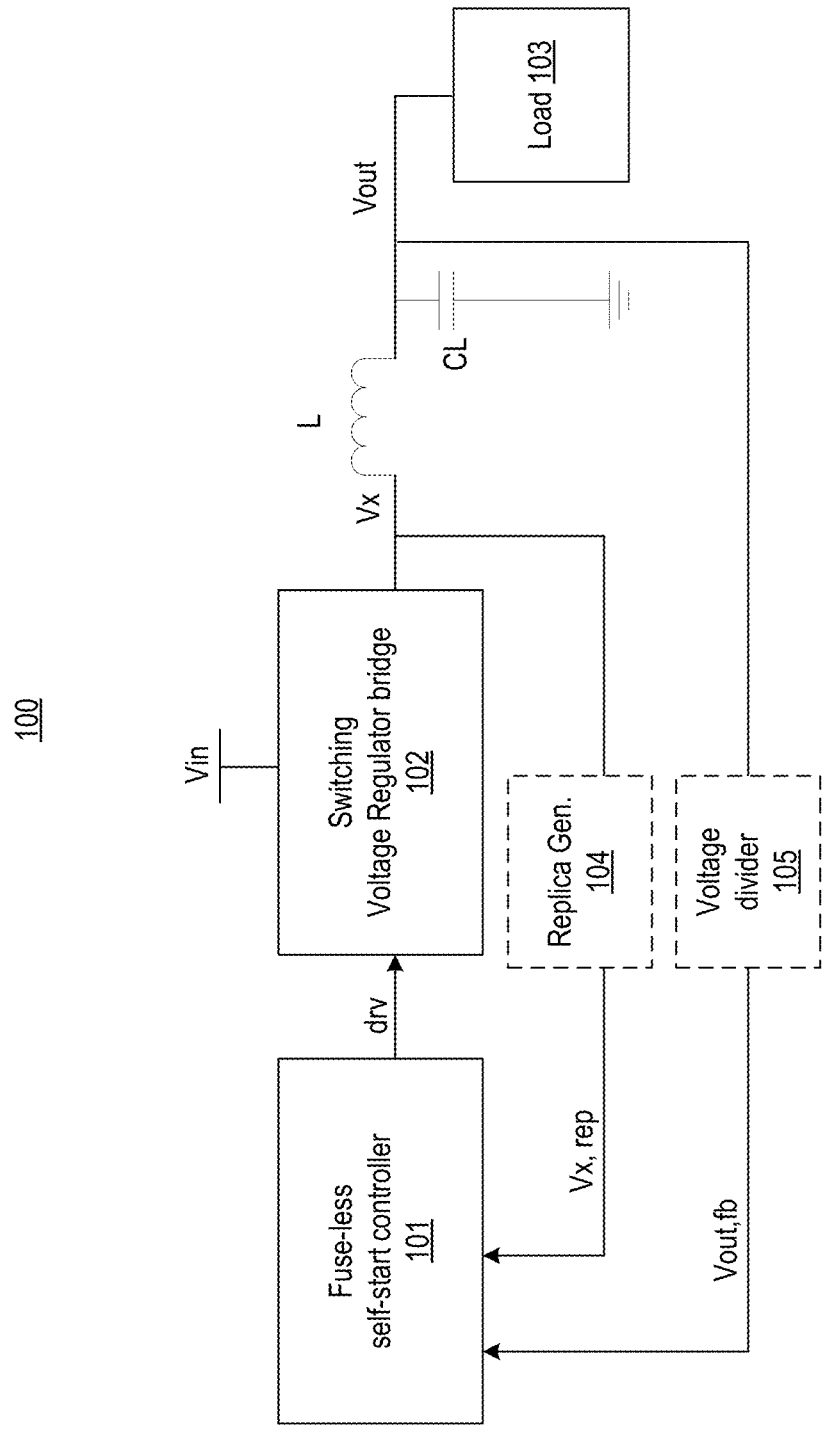
FIG. 1 illustrates a high-level architecture of a fuse-less self-start controller-based switching regulator, in accordance with some embodiments.

One way to provide output supply during startup is to use a buck converter in discontinuous conduction mode (DCM) to implement a simplified control strategy during startup, using a single comparator to determine whether the output is below the target and whether the output needs to be delivered a positive amount of charge. Another way to provide an output supply during startup is to use a voltage regulator (VR) on the motherboard to deliver power during startup.

Using a motherboard VR wastes valuable routing resources on the board to service the boot rail, which is merely necessary for a short amount of time while the system starts up. These resources are taken away from other rails, which can increase overall losses, harm efficiency, and add cost.

While a converter in DCM is easier to control, it still needs a workable technique for turning off the power switches at the end of the charge delivery cycle. This is accomplished using a zero-current detector (ZCD) circuit, which either relies on sensing current through the switch or a small (usually a few mV) voltage across a switch that is turned on. Both approaches are difficult to accomplish in advanced process technology nodes without access to fuses and/or trims. In addition, the high-side switch on-time sets the inductor peak current in a DCM converter. An untrimmed delay line or current integrating into a capacitor can have up to 3× variation in delay. For small inductors, the large peak current variation created by this variation can be catastrophic.

Various embodiments describe a separate self-start controller, which is functional without fuse and/or trim information. The self-start controller protects a DC-DC converter against large inrush currents and voltage overshoots, while being capable of following a variable VID (voltage identification) reference ramp imposed by the system. The apparatus of some embodiments uses a relaxation oscillator built into the controller to set the switching frequency of the buck converter. The oscillator can be initialized using either a clock or current reference to be close to a desired operating frequency. The output of the converter is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, an apparatus (e.g., processor, voltage regulator, system-on-chip, etc.) comprises a bridge and a self-start controller. The bridge comprises a high-side switch and a low-side switch. In some embodiments, the controller is coupled to the bridge, wherein the controller controls turn on and turn off activities of the high-side switch and the low-side switch. In some embodiments, the controller operates in an open loop configuration during startup and in the absence of information from one or more fuses, and thereafter operates in a closed loop configuration in the absence of information from the one or more fuses.

In some embodiments, the controller comprises: a comparator to compare a ramp voltage with a reference, wherein the ramp voltage is based on: a switch node common to the high-side switch and the low-side switch; and an output voltage on a load, wherein the load is coupled to the switch node via an inductor. In some embodiments, the controller comprises a multiplexer to by-pass the comparator in open loop configuration. In some embodiments, the multiplexer incorporates an output of the comparator in close loop configuration. In some embodiments, the controller comprises a latch to generate a pulse width modulated signal, to control the high-side switch and/or the low-side switch, according to a fixed on-period in the absence of information from one or more fuses. In some embodiments, the latch comprises an RS-latch. In some embodiments, an output of the comparator is coupled to a set pin of the RS-latch, wherein an output of a delay line is coupled to a reset pin of the RS-latch, and wherein an input of the delay line is coupled to the output of the comparator. In some embodiments, the controller comprises a ramp generator to generate the ramp voltage, wherein the ramp generator receives a voltage from the switch node or a replica of the switch node. The ramp generator receives the output voltage or a divided version of the output voltage. In some embodiments, the ramp generator comprises a filter coupled to a node that provides the output voltage, wherein the filter is coupled to the comparator. In some embodiments, the ramp generator comprises an integrator coupled to the filter and the comparator, wherein the integrator generates the ramp voltage as a triangular signal. In some embodiments, the integrator comprises a first capacitor coupled to ground, the comparator and the filter, and a second capacitor coupled in series with the first capacitor. In some embodiments, the second capacitor is coupled to the comparator and the filter. In some embodiments, the ramp generator comprises a resistor coupled in series with the second capacitor, wherein the resistor receives the voltage from the switch node or the replica of the switch node.

There are many technical effects of the various embodiments. For example, the apparatus and scheme of various embodiments uses a built-in, free-running oscillator to set the switching frequency. A simple output feedback network that works across PVT (process, voltage, and temperature) eliminates the need for complex compensation circuits at the cost of lower linear bandwidth while guaranteeing an output above the set point. The controller also guarantees minimal voltage overshoots and inrush current overshoots while following a set point ramp-up. These features allow for a truly fuse-less startup controller in advanced technology nodes that allows the on-chip converter to service the boot domains without adding to the Motherboard footprint. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a high-level architecture 100 of a fuse-less, self-start controller-based switching regulator, in accordance with some embodiments. Most controllers (steady-state controllers) for inductor-based switching converters (e.g. buck converter) employ complex compensation schemes to account for the complex conjugate LC-poles in the system. These compensation circuits often rely on a variety of fuses and trims for functionality. If fuse download during startup relies on the output of the converter being established, the steady-state controller cannot be used and a separate self-start controller is needed. Various embodiments describe such self-start controller.

In various embodiments, the self-start controller preferably uses as little system resources as possible while operating under the same constraints imposed by variation in advanced process nodes and the complex conjugate poles of the plant. However, certain performance constraints, such as the switching frequency, output accuracy and linear bandwidth can be relaxed during startup.

Architecture 100 comprises a fuse-less, self-start controller 101, switching voltage regulator bridge 102, load 103, replica generator 104, voltage divider 105, inductor L, and load capacitor CL. In some embodiments, fuse-less, self-start controller 101 comprises circuitry to control the duty cycle of a drive signal (dry). The dry signal controls the on and off times of the high-side and low-side switches in bridge 102. In various embodiments, the dry signal is a pulse width modulated (PWM) signal.

In some embodiments, the locally generated replica Vx,rep, of the converter switch node Vx is integrated using an RC integrator of controller 101 to create a triangular ramp. The lower level of the ramp is fixed at the output set point using a comparator. The dry control signal for bridge 102 is generated by a latch of controller 101. The ramp signal is generated using Vout,fb (feedback Vout). Vout,fb can be Vout or a divided version of Vout. For example, voltage divider 105 may provide a divided down voltage Vout,fb to controller 101 to generate the ramp signal. When the comparator of controller 101 trips, the drive signal is turned HIGH, i.e. high-side switch of bridge 102 is turned on. The drive signal remains high for a predetermined time (or a programmable time). By turning on the high-side switch of bridge 102, the voltage on Vx rises. The off time of the drive signal is set by the time it takes the ramp voltage to come down to the set point. Here, signal names and node names are interchangeably used. For example, Vx may refer to node name Vx or signal Vx on node Vx, depending on the context of the sentence. In various embodiments, load 103 is any suitable load such as a processor, one or more processor cores, a system-on-chip, logic domain of the processor, etc.

Figure 2:
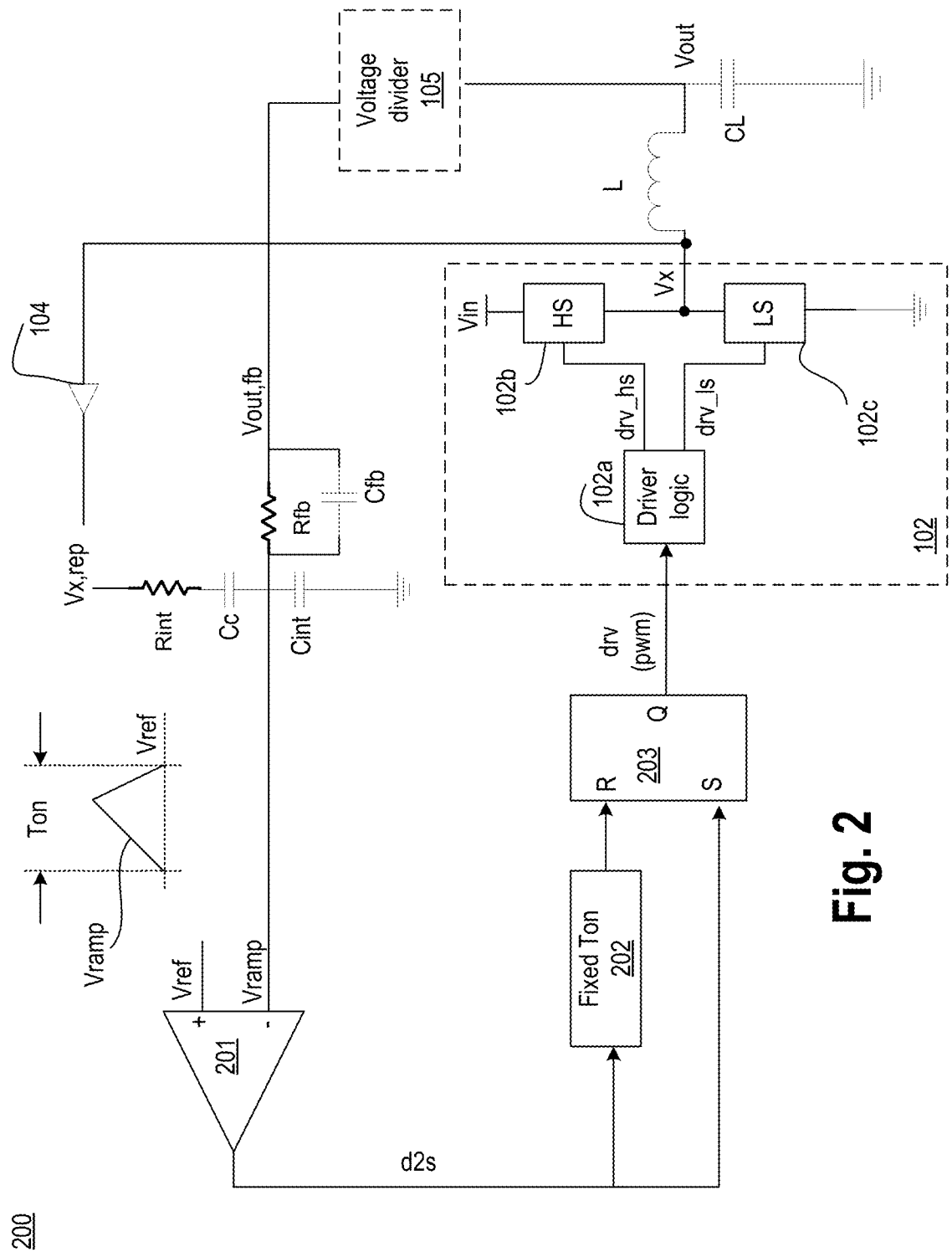
FIG. 2 illustrates a block diagram of the fuse-less self-start controller coupled to a bridge, in accordance with some embodiments.

FIG. 2 illustrates a block diagram or schematic 200 of fuse-less, self-start controller 101 coupled to bridge 102, in accordance with some embodiments. In some embodiments, fuse-less, self-start controller 101 comprises comparator 201, delay circuitry 202, latch 203, coupling capacitor Cc, integration capacitor Cint, feedback capacitor Cfb, integration resistor Rint, and feedback resistor Rfb coupled as shown. In various embodiments, the capacitors and/or resistors can be implemented using any suitable device. For example, the capacitors can be implemented as discrete devices, metal capacitors, metal-insulator-metal capacitors, ferroelectric capacitors, transistors configured as capacitors, or a combination of metal capacitors and transistors configured as capacitors. In some embodiments, the resistors are implemented as discrete resistors and/or transistors operating in a linear operation region.

In some embodiments, bridge 102 comprises driver logic 102a, high-side (HS) switch 102b, and low-side (LS) switch 102c. A person skilled in the art would appreciate that bridge 102 is a simplified expression of a bridge. A bridge may include one or more phases, bias transistors, etc. HS switch 102b is coupled to an input supply node or rail Vin and to converter or bridge switch node Vx. LS switch 102c is coupled to a ground supply node or rail and to the bridge switch node Vx. Other devices can also be coupled in series between HS switch 102b and LS switch 102c. HS switch 102b is controlled by drv_hs while LS switch 102c is controlled by drv_ls. Both drv_hs and drv_ls are derived from dry signal (e.g., PWM signal).

In some embodiments, HS switch 102b comprises a p-type transistor or device. In some embodiments, HS switch 102b comprises an n-type device. In some embodiments, HS switch 102b is a combination of an n-type device and a p-type device. In some embodiments, LS switch 102c comprises a p-type transistor or device. In some embodiments, LS switch 103b comprises an n-type device. In some embodiments, LS switch 102c is a combination of an n-type device and a p-type device. In some embodiments, HS switch 102b and LS switch 102c have devices of the same conductivity type. For example, both HS switch 102b and LS switch 102c comprise p-type devices, or both HS switch 102b and LS switch 102c comprise n-type devices.

In some embodiments, a locally generated replica of the converter switch node Vx is integrated using an RC integrator comprising resistor Rint and capacitors Cc and Cint to create a triangular ramp (Vramp). In some embodiments, Vx is directly used without replicating it. In some embodiments, replica generator 104 comprises a buffer or inverter. In some embodiments, replica generator 104 comprises a unit-gain buffer. One reason for using replica generator 104 is to avoid routing noisy signals such as Vx into the controller region. In some embodiments, replica Vx can be generated from the actual Vx or completely locally within the controller from the dry (pwm) signal.

The lower level of the ramp is fixed at the output set point using comparator 201. Comparator 201 compares Vref to Vramp to generate output d2s. Vref can be generated by any suitable source. For example, Vref is a reference voltage generated off-die and provided to comparator 201 via a package pin. In some embodiments, Vref is generated by an off-die band-gap circuit. Comparator 201 can be a single stage comparator or a multi-stage amplifier. The PWM control signal for the buck converter is generated by latch 203. In some embodiments, latch 203 is a Set-Reset latch (RS latch). When the output d2s of comparator 201 trips, the dry signal is turned high, i.e. HS switch 102b is turned on by driver 102a. While as shown here, turning dry signal high is used to turn on HS switch 102b, the logic can be reversed depending on the conductivity of the device(s) of HS switch 102b. For example, when HS switch 102b is a p-type device and driver logic 102a is a buffer, then a logic low drive signal turns on HS switch 102b.

Here, the closed loop configuration comprising an electrical path from Vout through comparator 201 fixed HS Ton 202, latch 203, and bridge 102 forms an oscillator (a relaxation oscillator). This oscillator is initialized using either a clock or current reference to be close to a desired operating frequency. In some embodiments, the output of bridge 102 is weakly coupled to the oscillator to set the duty cycle of dry signal for closed loop operation. Controller 101 is naturally biased such that the output voltage Vout is always slightly higher than the set point, eliminating the need for any PVT imposed trims, in accordance with some embodiments.

In some embodiments, on-time (Ton) for the PWM signal (or dry signal) is set to a fixed duration in fixed Ton circuitry 202, which can be set either by an available reference, such as a system clock or current reference. In the case of a current reference, the current can be integrated over a capacitor until the voltage crosses a voltage reference derived from a bandgap, which is typically available in the system. In the case of an available system clock of known frequency, the clock can be passed through a delay line which should preferably be designed to produce one full cycle of delay across process, voltage, and temperature (PVT) variation. One such circuit to determine Ton is illustrated with reference to FIG. 3.

Figure 3:
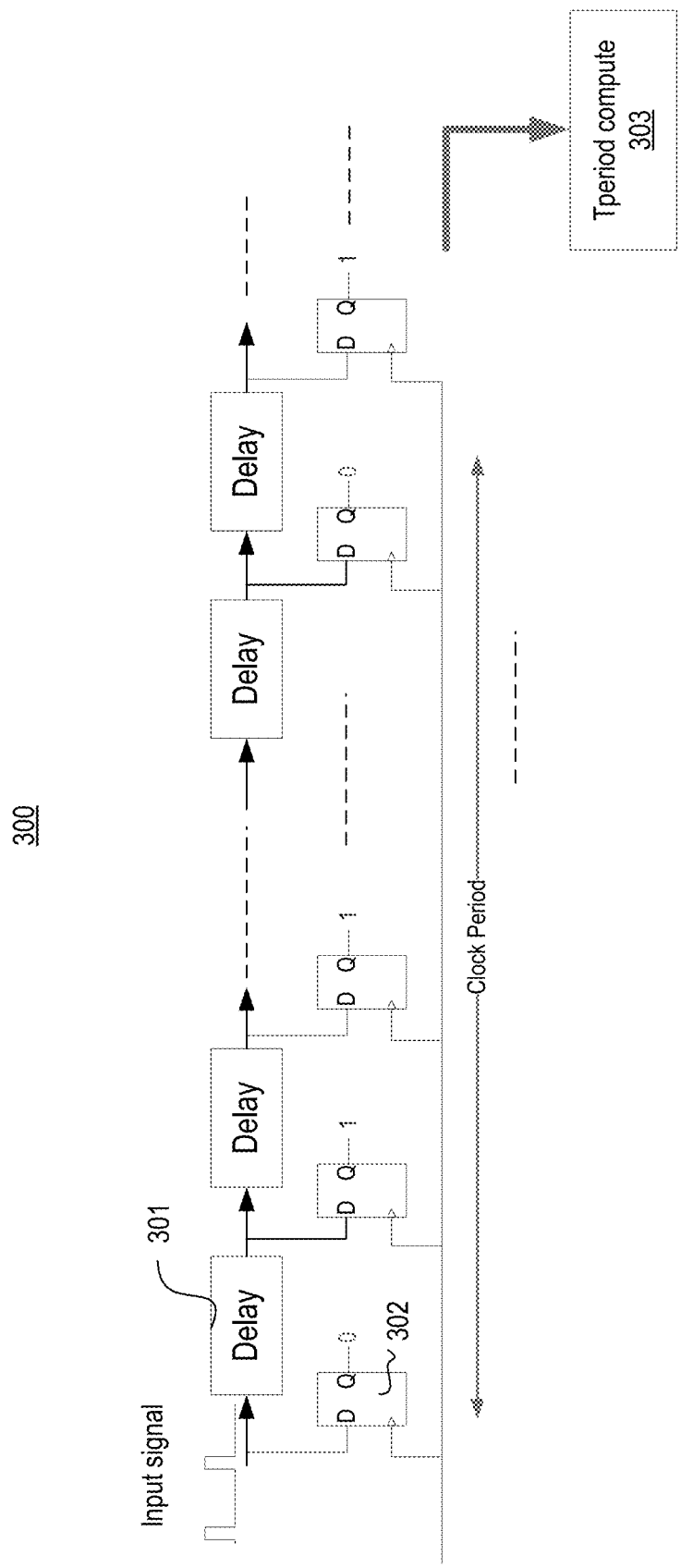
FIG. 3 illustrates an apparatus for calibrating a delay cell used for time period estimation, in accordance with some embodiments.

FIG. 3 illustrates apparatus 300 for calibrating a delay cell used for time period estimation, in accordance with some embodiments. Apparatus 300 comprises a delay chain formed of delay units (or delay stages) 301 coupled in series, and a set of flip-flops (or latched or other sequential units) coupled to outputs of each delay stage. For example, flip-flop 302 is coupled to the output of delay stage 301. To determine Ton time, first the delay stages or delay cells 301 are calibrated. For example, first, a clock signal is input to the first delay cell 301 and the clock inputs of flip-flops 302. The clock passes through the delay line, whose taps are latched by the subsequent clock edge. The outputs of each flip-flop 302 is monitored to determine when the output of the flip-flop transitions. The latched word (output of all flip-flops 302 or latches) can be analyzed using combinational circuits for 0→1 and 1→0 transitions to yield both the clock duty cycle and period. This analysis is performed by Tperiod compute logic 303. The clock period can be computed by Tperiod compute logic 303 in terms of the nearest integer multiple of unit delay cell 301 once when controller 101 is enabled. Since the frequency of the clock reference is known, a fixed fraction of the number of delay cells 301 corresponding to one clock period can be used to set a fixed on-time for the PWM signal.

In various embodiments, fixed Ton 202 comprises the delay chain of FIG. 3. The output of delay chain that corresponds to the clock period or a Ton period is tapped by a multiplexer (not shown). In some embodiments, the inputs of the multiplexer are coupled to the input of each flip-flop 302 (or output of each delay cell 301). The output of the multiplexer is controlled by Tperiod compute logic 303 which provides the output of delay cell 301 from the delay chain that corresponds to a desired Ton period (e.g., period of a PWM signal).

Referring back to FIG. 2, the off time of the PWM signal (dry signal) is set by the time it takes the ramp voltage Vramp to come down to the set point. This is determined both by the RC time constant (e.g., time constant of Rint and Cint) of the ramp-generation circuitry, as well as the output feedback Vout,fb from the converter or bridge 102. The converter output Vout,fb is coupled to the ramp using a resistor Rfb in parallel with a capacitor Cfb. Keeping resistance of resistor Rfb larger than the resistance of integration resistor Rint of the ramp-generation circuitry ensures adequate phase margin in the system, while capacitor Cfb improves the response time of the ramp to sudden changes due to load transients, etc.

The fixed PWM on-time by fixed Ton circuitry 202 results in the ramp height being modulated according to the process corner and temperature of operation, which subsequently keeps a check on the off-time of the PWM (dry signal) as well to maintain a given duty cycle. Thus, despite a variation (e.g., ±25%) on each resistor and capacitor across PVT, the frequency of operation only varies by, for example, ±15% overall.

The ramp generation circuitry also includes a DC-decoupling capacitor Cc. Capacitor Cc prevents any DC current being sourced from or sunk into the output feedback line arising from variations in the controller supply that generates Vx,rep. This ensures that the average value of Vramp is equal to the output feedback. Since the lower limit of Vramp is constrained to be at the output set point, the output voltage Vout is guaranteed to be above the set point across PVT.

Figure 4:
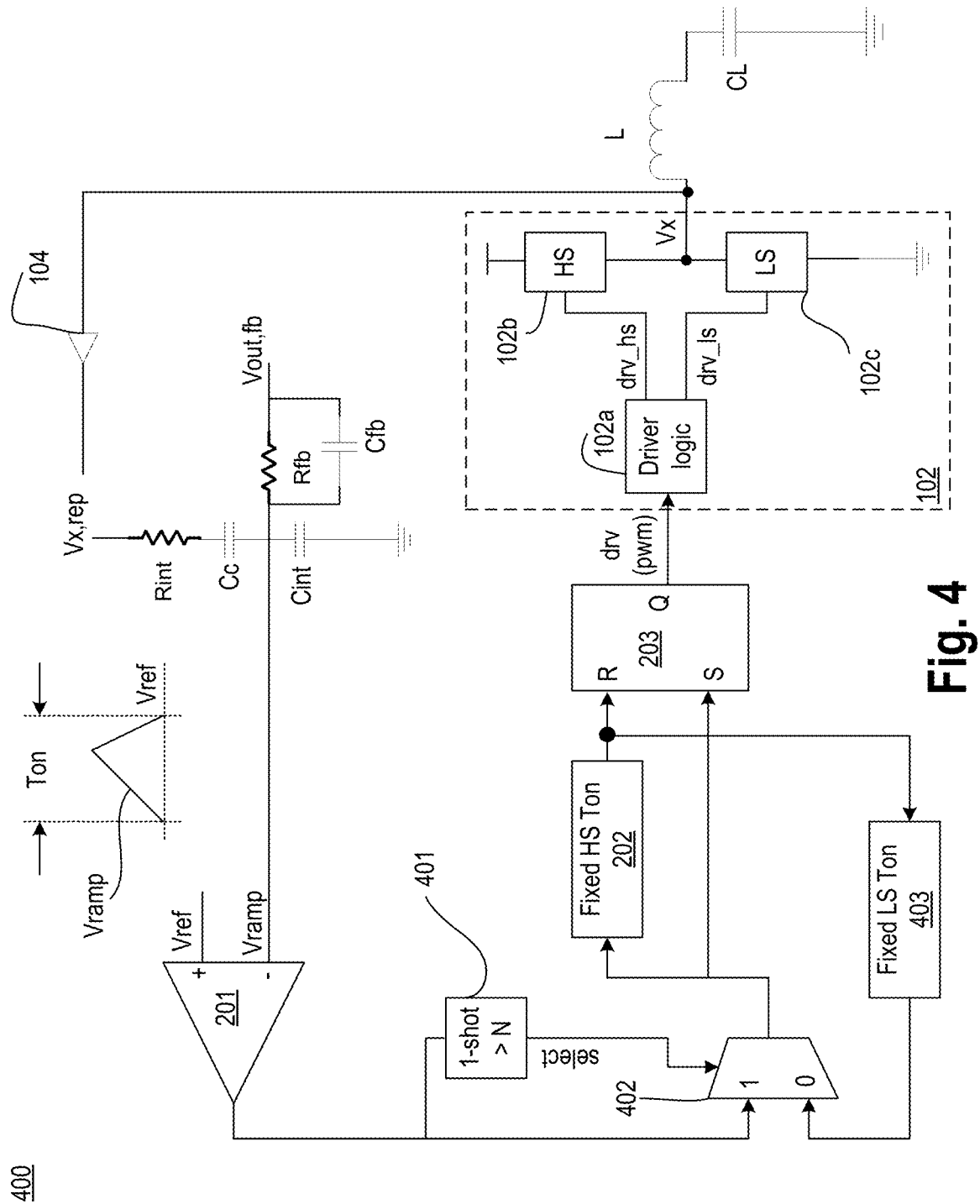
FIG. 4 illustrates a block diagram of the fuse-less self-start controller with open loop startup and coupled to a bridge, in accordance with some embodiments.

FIG. 4 illustrates block diagram 400 of the fuse-less, self-start controller with open loop startup and coupled to a bridge, in accordance with some embodiments. Compared to FIG. 2, block diagram 400 comprises a 1-shot latch or flip-flop 401, multiplexer 402, and fixed LS Ton circuitry 403. When controller 101 starts up, both the ramp (Vramp) and the output (Vout) set point reference voltages are close to zero, where comparator 201 might not be able to operate accurately with the expected response time. Here, Vref starts ramping from zero to a steady state value upon bootup. This steady state value is the set point reference voltage.

During this time, converter 101 can be operated in open loop with the PWM on-time being set by a single tap of the delay line (of FIG. 3) and the period set by the clock period or the entire length of the delay line. In open loop, the output of comparator 201 is not used to determine the PWM signal (or dry signal), which determines the ON time of HS switch 102b. In the open loop, multiplexer 402 selects output of delay line in fixed LS Ton circuitry 402 as the initial ON time. In some embodiments, multiplexer 402 is controlled by select signal from 1-shot flip-flop 401. Here, 1-shot flip-flop 401 provides a sticky output "select" to force multiplexer 402 to select the output of fixed LS Ton in open loop.

The select line of multiplexer 402 starts off at 0 upon bootup, forcing the use of the fixed LS on time 403, since comparator 201 cannot reliably be expected to toggle. Once Vref and Vramp have risen enough to start toggling the output of comparator 201 over N consecutive cycles, 1-shot latch 401 sets the select signal of multiplexer 401 to 1, which starts the closed loop operation.

The open loop configuration ensures a low duty cycle for dry signal (PWM signal) and minimizes both the output voltage (Vout) and inrush current overshoots during startup. Once the ramp Vramp (also referred to as VID ramp) crosses the output voltage Vout,fb established by this open loop operation, the output of comparator 201 starts toggling. This can be detected by 1-shot circuitry 401 to transition into closed loop operation by ramping up the on-time to the steady-state value computed by the period estimator 303 and using the ramp crossing the reference to set the PWM off-time. For example, upon detecting a toggling comparator 201, 1-shot circuitry 401 selects the output of comparator 201 as input of fixed HS Ton 202, and the controller operates as discussed with reference to closed loop configuration of FIG. 2.

Figure 5:
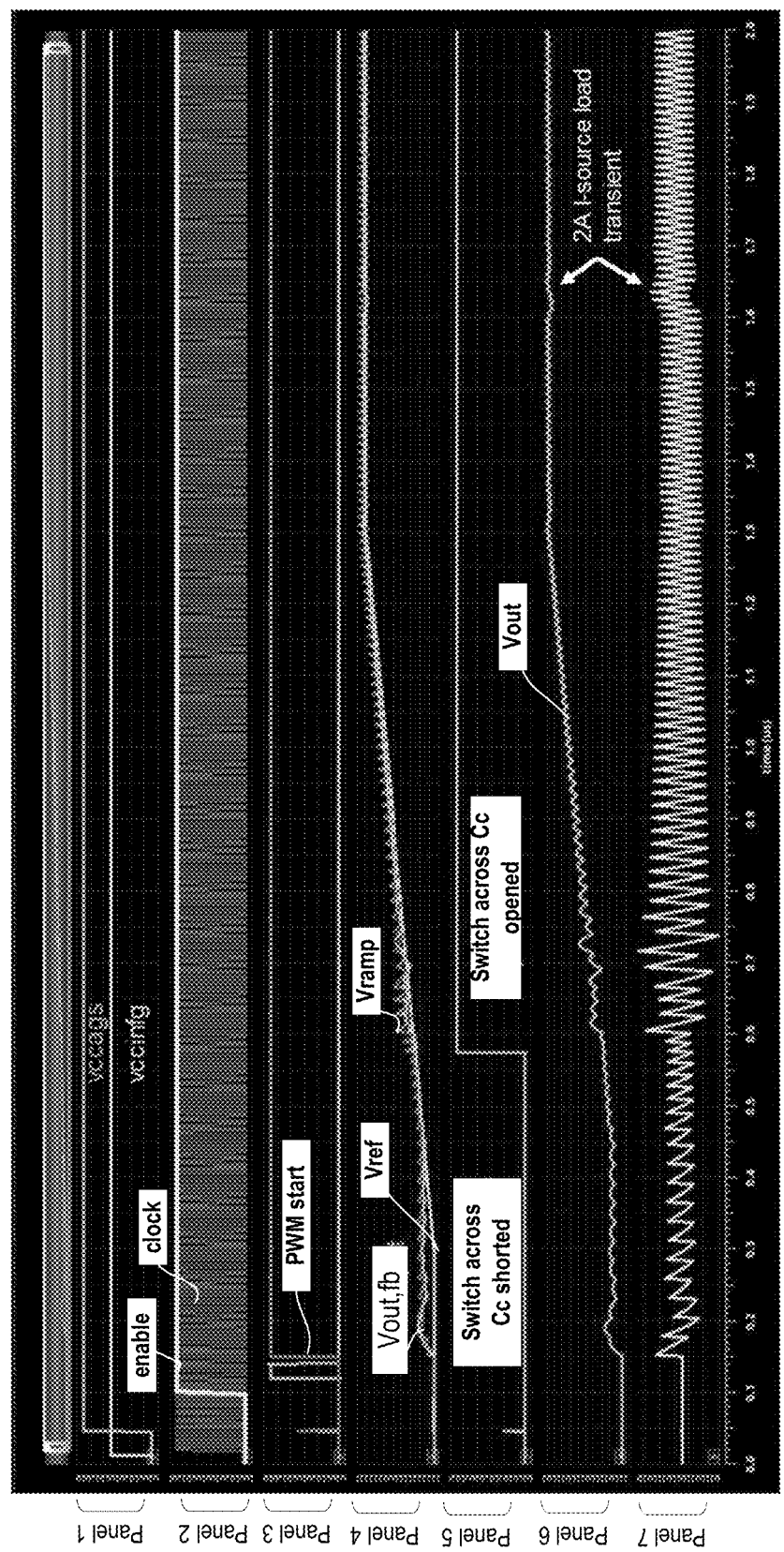
FIG. 5 illustrates a set of plots showing operation of the fuse-less self-start controller, in accordance with some embodiments.

FIG. 5 illustrates a set of plots 500 showing operation of the fuse-less, self-start controller, in accordance with some embodiments. The set of plots 500 shows state transitions during startup showing open loop operation (switch across Cc shorted) followed by transition to closed loop operation (switch across Cc opened). Panel 1 shows the infrastructure and control supplies ramping up after boot. Panel 2 shows a reference clock and self-start enable signal. Panel 3 shows a delay line calibration and PWM start signals, both generated by the state machine inside the controller. Panel 4 illustrates the Vramp, Vref and Vfb. Vref starts ramping up some time after self-start is enabled. In that time the output voltage settles to its open loop value determined by the HS and LS on times. Once Vref starts approaching Vramp, comparator 201 starts toggling. Multiplexer 402 switches over to the comparator output, initiating closed loop operation. The switch shorting coupling capacitor Cc is opened to ensure Vout is above Vref (Cc starts off being shorted to ensure ramp stability at startup). Panel 6 shows the output voltage (Vout) while panel 7 shows the inductor current.

Figure 6:
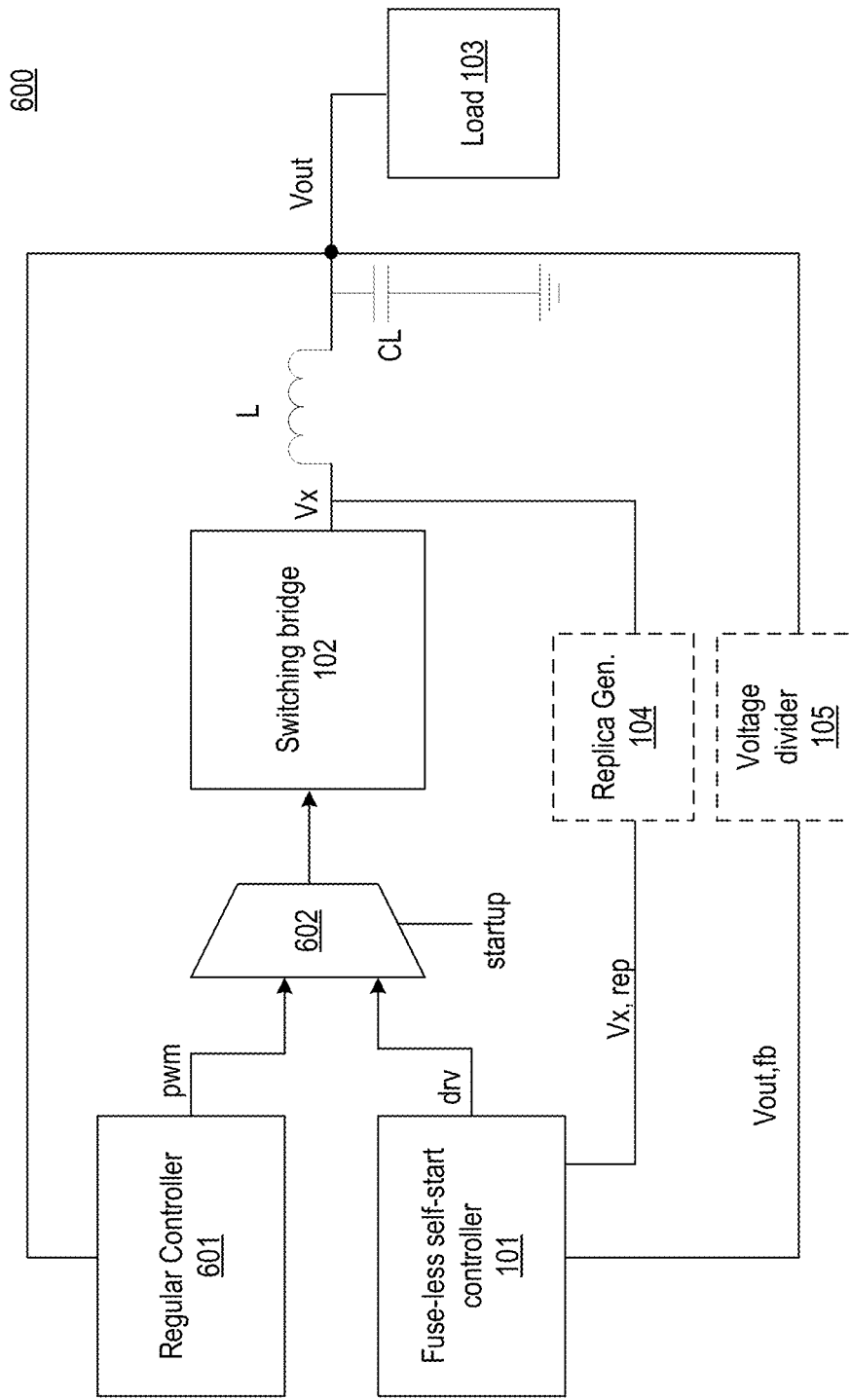
FIG. 6 illustrates a voltage regulator with fuse-less self-start controller for startup and regular controller for post-startup operation, in accordance with some embodiments.

FIG. 6 illustrates voltage regulator (VR) 600 with fuse-less, self-start controller for startup and regular controller for post-startup operation, in accordance with some embodiments. VR 600 comprises regulator controller 601, fuse-less self-start controller 101, multiplexer 602, switching bridge 102, and other components discussed with reference to other embodiments herein. Here, regular controller 601 is any typical PWM based controller for voltage regulation. In various embodiments, at startup when fuses and/or trimming capability is not available (or is absent), multiplexer 602 selects dry output from fuse-less, self-start controller 101 for switching bridge 102 to regulate Vout. In some embodiments, once the fuses are functional and available for use, fuse-less controller 101 is disabled, allowing VR 600 to be controlled by its regular controller 601. In some embodiments, the transition between fuse-less controller 101 and regular controller 601 occurs before the first voltage droop on Vout. This transition is realized by the startup signal that controls the select input of multiplexer 602. In some embodiments, the transition between fuse-less controller 101 and regular controller 601 occurs after a predetermined time or programmable time from when the fuses become functional. Once the output is established, fuses are downloaded and the steady-state controller is initialized While various embodiments are described with reference to fuse-less startup of switching buck converter. The embodiments are also applicable to other types of switching regulators such as boost converter, buck-boost converter, etc.

Figure 7:
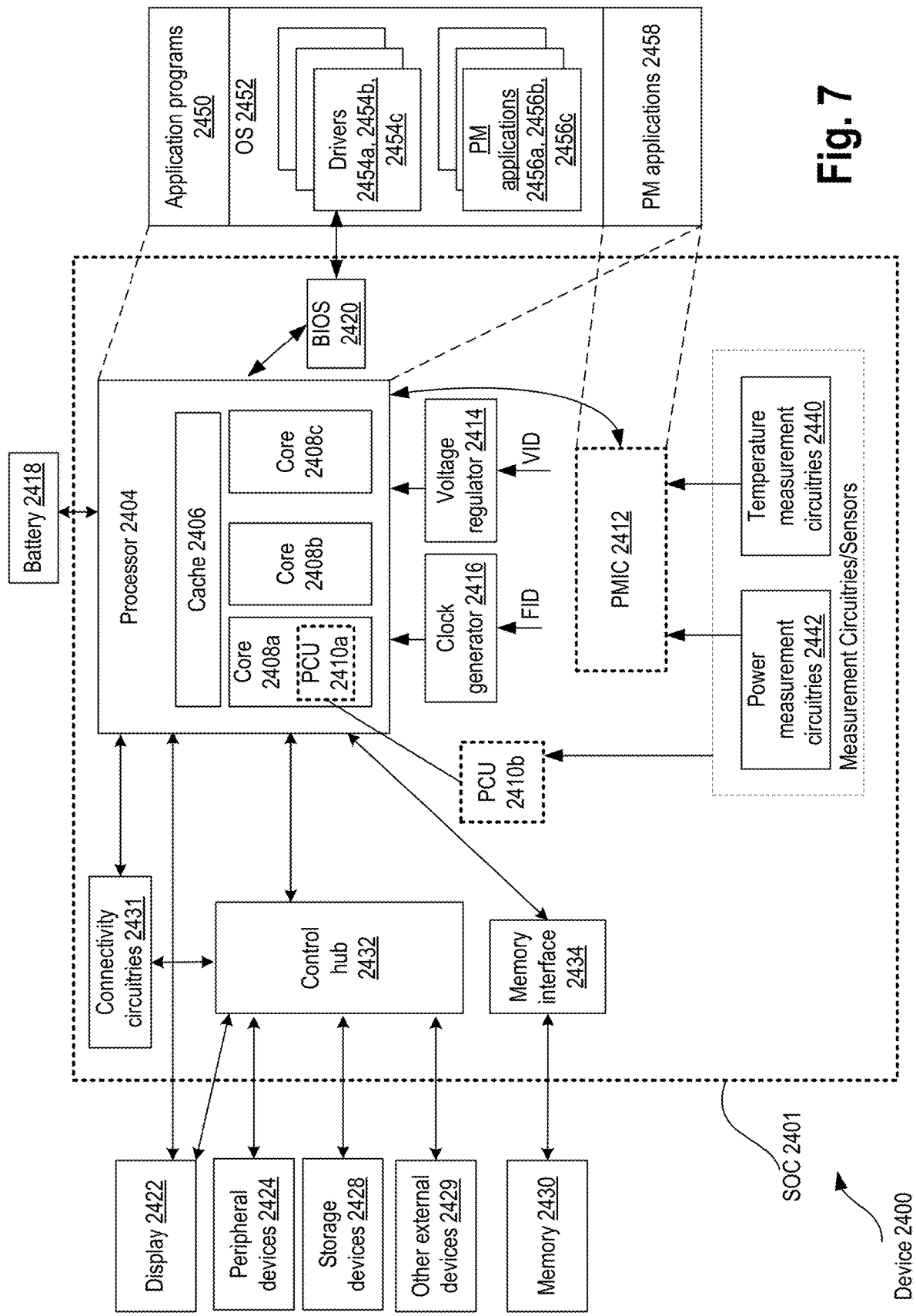
FIG. 7 illustrates a smart device or a computer system or a SoC (System-on-Chip) with fuse-less self-start controller-based switching regulator, in accordance with some embodiments.

FIG. 7 illustrates a smart device or a computer system or a SoC (System-on-Chip) with fuse-less self-start controller-based switching regulator, in accordance with some embodiments. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 7, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 7, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, VR 2414 includes a separate self-start controller, which is functional without fuse and/or trim information. The self-start controller protects VR 2414 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 2414 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labeled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor (s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410*a/b* has a capability to enable extra compute and telemetries resources for the runtime support of the pCode. Here pCode refers to a firmware executed by PCU 2410*a/b* to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SCO 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

In some embodiments, VR 2414 includes a current sensor to sense and/or measure current through a high-side switch of VR 2414. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a bridge comprising a high-side switch and a low-side switch; and a controller coupled to the bridge, wherein the controller comprises: a latch to generate a pulse width modulated signal, to control the high-side switch and/or the low-side switch, according to a fixed on-period in an absence of information from one or more fuses; and a comparator to compare a ramp voltage with a reference, wherein an output of the comparator controls the latch, wherein the ramp voltage is based on: a switch node common to the high-side switch and the low-side switch; and an output voltage on a load, wherein the load is coupled to the switch node via an inductor.

Example 2: The apparatus of example 1 comprises a ramp generator to generate the ramp voltage, wherein the ramp generator is to receive a voltage from the switch node or a replica of the switch node, and to receive the output voltage or a divided version of the output voltage.

Example 3: The apparatus of example 2, wherein the ramp generator comprises: a filter coupled to a node that provides the output voltage, wherein the filter is coupled to the comparator; and an integrator coupled to the filter and the comparator, wherein the integrator is to generate the ramp voltage as a triangular signal.

Example 4: The apparatus of example 3, wherein the integrator comprises: a first capacitor coupled to a ground, the comparator and the filter; a second capacitor coupled in series with the first capacitor, wherein the second capacitor is coupled to the comparator and the filter; and a resistor coupled in series with the second capacitor, wherein the resistor is to receive the voltage from the switch node or the replica of the switch node.

Example 5: The apparatus of example 2 comprises an inverter or a buffer coupled to the switching node and the ramp generator, wherein the inverter or the buffer is to provide a voltage which is a replica voltage on the switch node.

Example 6: The apparatus of example 1 comprises a delay line calibrated to provide the fixed on-period.

Example 7: The apparatus of example 6, wherein the latch comprises an RS-latch.

Example 8: The apparatus of example 7, wherein an output of the comparator is coupled to a set pin of the RS-latch, and wherein an output of the delay line is coupled to a reset pin of the RS-latch.

Example 9: An apparatus comprising: a bridge comprising a high-side switch and a low-side switch; and a controller coupled to the bridge, wherein the controller is to control turn on and turn off activities of the high-side switch and the low-side switch, wherein the controller is to operate in an open loop configuration, during startup and in an absence of information from one or more fuses, and thereafter operate in a closed loop configuration in the absence of information from the one or more fuses.

Example 10: The apparatus of example 9, wherein the controller comprises: a comparator to compare a ramp voltage with a reference, wherein the ramp voltage is based on: a switch node common to the high-side switch and the low-side switch; and an output voltage on a load, wherein the load is coupled to the switch node via an inductor.

Example 11: The apparatus of example 10 comprises a multiplexer to by-pass the comparator in open loop configuration.

Example 12: The apparatus of example 11, wherein the multiplexer is to incorporate output of the comparator in close loop configuration.

Example 13: The apparatus of example 10, wherein the controller comprises a latch to generate a pulse width modulated signal, to control the high-side switch and/or the low-side switch, according to a fixed on-period in the absence of information from one or more fuses.

Example 14: The apparatus of example 13, wherein the latch comprises an RS-latch.

Example 15: The apparatus of example 14, wherein an output of the comparator is coupled to a set pin of the RS-latch, wherein an output of a delay line is coupled to a reset pin of the RS-latch, and wherein an input of the delay line is coupled to the output of the comparator.

Example 16: The apparatus of example 10, wherein the controller comprises a ramp generator to generate the ramp voltage, wherein the ramp generator is to receive a voltage from the switch node or a replica of the switch node, and to receive the output voltage or a divided version of the output voltage.

Example 17: The apparatus of example 16, wherein the ramp generator comprises: a filter coupled to a node that provides the output voltage, wherein the filter is coupled to the comparator; and an integrator coupled to the filter and the comparator, wherein the integrator is to generate the ramp voltage as a triangular signal.

Example 18: The apparatus of example 17, wherein the integrator comprises: a first capacitor coupled to a ground, the comparator and the filter; a second capacitor coupled in series with the first capacitor, wherein the second capacitor is coupled to the comparator and the filter; and a resistor coupled in series with the second capacitor, wherein the resistor is to receive the voltage from the switch node or the replica of the switch node.

Example 19: A system comprising: a memory; a processor coupled to the memory; and a wireless interface to allow the processor to communicate with another device, wherein the processor includes a voltage regulator comprising: a bridge comprising a high-side switch and a low-side switch; and a controller coupled to the bridge, wherein the controller is to control turn on and turn off activities of the high-side switch and the low-side switch, wherein the controller is to operate in open loop configuration, during startup and in an absence of information from one or more fuses, and thereafter operate in closed loop configuration in the absence of information from the one or more fuses.

Example 20: The system of example 19, wherein the controller comprises: a comparator to compare a ramp voltage with a reference, wherein the ramp voltage is based on: a switch node common to the high-side switch and the low-side switch; and an output voltage on a load, wherein the load is coupled to the switch node via an inductor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a bridge comprising a high-side switch and a low-side switch; and
a controller coupled to the bridge, wherein the controller comprises:
a latch to generate a pulse width modulated signal, to control the high-side switch and/or the low-side switch, according to a fixed on-period; and
a comparator to compare a ramp voltage with a reference, wherein an output of the comparator controls the latch, wherein the ramp voltage is based on:
a switch node common to the high-side switch and the low-side switch; and
an output voltage on a load, wherein the load is coupled to the switch node via an inductor,
a ramp generator to generate the ramp voltage, wherein the ramp generator is to receive a voltage from the switch node or a replica of the switch node, and to receive the output voltage or a divided version of the output voltage, wherein the ramp generator comprises:
a filter coupled to a node that provides the output voltage, wherein the filter is coupled to the comparator; and
an integrator coupled to the filter and the comparator, wherein the integrator is to generate the ramp voltage as a triangular signal.

2. The apparatus of claim 1, wherein the integrator comprises:
a first capacitor coupled to a ground, the comparator and the filter;
a second capacitor coupled in series with the first capacitor, wherein the second capacitor is coupled to the comparator and the filter; and
a resistor coupled in series with the second capacitor, wherein the resistor is to receive the voltage from the switch node or the replica of the switch node.

3. The apparatus of claim 1, further comprising an inverter or a buffer coupled to the switching node and the ramp generator, wherein the inverter or the buffer is to provide a voltage which is a replica voltage on the switch node.

4. The apparatus of claim 1, further comprising a delay line calibrated to provide the fixed on-period.

5. The apparatus of claim 4, wherein the latch comprises an RS-latch.

6. The apparatus of claim 5, wherein an output of the comparator is coupled to a set pin of the RS-latch, and wherein an output of the delay line is coupled to a reset pin of the RS-latch.

7. An apparatus comprising:
a bridge comprising a high-side switch and a low-side switch; and
a controller coupled to the bridge, wherein the controller is to control turn on and turn off activities of the high-side switch and the low-side switch, wherein the controller is to operate in an open loop configuration during startup and thereafter operate in a closed loop configuration, wherein the controller comprises:
a comparator to compare a ramp voltage with a reference, wherein the ramp voltage is based on:
a switch node common to the high-side switch and the low-side switch; and
an output voltage on a load, wherein the load is coupled to the switch node via an inductor; and
a latch to generate a pulse width modulated signal to control the high-side switch and/or the low-side switch according to a fixed on-period.

8. The apparatus of claim 7, further comprising a multiplexer to by-pass the comparator in the open loop configuration.

9. The apparatus of claim 8, wherein the multiplexer is to incorporate an output of the comparator in the closed loop configuration.

10. The apparatus of claim 7, wherein the latch comprises an RS-latch.

11. The apparatus of claim 10, wherein an output of the comparator is coupled to a set pin of the RS-latch, wherein an output of a delay line is coupled to a reset pin of the RS-latch, and wherein an input of the delay line is coupled to the output of the comparator.

12. The apparatus of claim 7, wherein the controller comprises a ramp generator to generate the ramp voltage, wherein the ramp generator is to receive a voltage from the switch node or a replica of the switch node, and to receive the output voltage or a divided version of the output voltage.

13. The apparatus of claim 12, wherein the ramp generator comprises:
a filter coupled to a node that provides the output voltage, wherein the filter is coupled to the comparator; and
an integrator coupled to the filter and the comparator, wherein the integrator is to generate the ramp voltage as a triangular signal.

14. The apparatus of claim 13, wherein the integrator comprises:
a first capacitor coupled to a ground, the comparator and the filter;
a second capacitor coupled in series with the first capacitor, wherein the second capacitor is coupled to the comparator and the filter; and
a resistor coupled in series with the second capacitor, wherein the resistor is to receive the voltage from the switch node or the replica of the switch node.

15. A system comprising:
a memory;
a processor coupled to the memory; and
a wireless interface to allow the processor to communicate with another device, wherein the processor includes a voltage regulator comprising:
a bridge comprising a high-side switch and a low-side switch; and
a controller coupled to the bridge, wherein the controller is to control turn on and turn off activities of the high-side switch and the low-side switch, wherein the controller is to operate in open loop configuration during startup and thereafter operate in closed loop configuration, wherein the controller comprises:
a comparator to compare a ramp voltage with a reference, wherein the ramp voltage is based on:
a switch node common to the high-side switch and the low-side switch; and
an output voltage on a load, wherein the load is coupled to the switch node via an inductor; and
a latch to generate a pulse width modulated signal to control the high-side switch and/or the low-side switch according to a fixed on-period.

16. The system of claim 15, wherein the latch is an RS-latch, wherein an output of the comparator is coupled to a set pin of the RS-latch, wherein an output of a delay line is coupled to a reset pin of the RS-latch, and wherein an input of the delay line is coupled to the output of the comparator.

17. An apparatus comprising: a bridge comprising a high-side switch and a low-side switch; and a controller coupled to the bridge, wherein the controller comprises: a latch to generate a pulse width modulated signal, to control the high-side switch and/or the low-side switch, according to a fixed on-period; a comparator to compare a ramp voltage with a reference, wherein an output of the comparator controls the latch, wherein the ramp voltage is based on: a switch node common to the high-side switch and the low-side switch; and an output voltage on a load, wherein the load is coupled to the switch node via an inductor; and an inverter or a buffer coupled to the switching node and a ramp generator, wherein the inverter or the buffer is to provide a voltage which is a replica voltage on the switch node.

18. The apparatus of claim 17, further comprising a delay line calibrated to provide the fixed on-period.

19. The apparatus of claim 18, wherein the latch comprises an RS-latch, wherein an output of the comparator is coupled to a set pin of the RS-latch, and wherein an output of the delay line is coupled to a reset pin of the RS-latch.

20. An apparatus comprising:
a bridge comprising a high-side switch and a low-side switch; and
a controller coupled to the bridge, wherein the controller is to control turn on and turn off activities of the high-side switch and the low-side switch, wherein the controller is to operate in an open loop configuration during startup and thereafter operate in a closed loop configuration, wherein the controller comprises a ramp generator to generate the ramp voltage, and wherein the ramp generator is to receive a voltage from the switch node or a replica of the switch node, and to receive the output voltage or a divided version of the output voltage, wherein the ramp generator comprises:
a filter coupled to a node that provides the output voltage, wherein the filter is coupled to the comparator; and
an integrator coupled to the filter and the comparator, wherein the integrator is to generate the ramp voltage as a triangular signal.

21. The apparatus of claim 20, wherein the integrator comprises:
a first capacitor coupled to a ground, the comparator and the filter;
a second capacitor coupled in series with the first capacitor, wherein the second capacitor is coupled to the comparator and the filter; and a resistor coupled in series with the second capacitor, wherein the resistor is to receive the voltage from the switch node or the replica of the switch node.

\* \* \* \* \*